(12) United States Patent
Lee et al.

(10) Patent No.: US 8,629,538 B2
(45) Date of Patent: Jan. 14, 2014

(54) POWER MODULE PACKAGE

(75) Inventors: Young Ki Lee, Gyunggi-do (KR);
Young Ho Sohn, Gyunggi-do (KR);
Kwang Soo Kim, Gyunggi-do (KR);
Chang Hyun Lim, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 121 days.

(21) Appl. No.: 13/316,072

(22) Filed: Dec. 9, 2011

(65) Prior Publication Data
US 2013/0069210 A1    Mar. 21, 2013

(30) Foreign Application Priority Data
Sep. 16, 2011    (KR) .......................... 10-2011-0093561

(51) Int. Cl.
*H01L 23/495* (2006.01)

(52) U.S. Cl.
USPC .................... 257/668; 257/676; 257/E23.042

(58) Field of Classification Search
USPC ................................... 257/668, 676, E23.042
See application file for complete search history.

(56) References Cited

U.S. PATENT DOCUMENTS

| | | | | |
|---|---|---|---|---|
| 6,144,571 A | * | 11/2000 | Sasaki et al. | 363/144 |
| 7,728,416 B2 | * | 6/2010 | Satou et al. | 257/676 |
| 8,207,607 B2 | * | 6/2012 | Yamagishi et al. | 257/724 |

FOREIGN PATENT DOCUMENTS

| | | |
|---|---|---|
| JP | 06-283639 | 10/1994 |
| KR | 10-0342589 | 5/2001 |
| KR | 10-2009-0050750 | 5/2009 |

OTHER PUBLICATIONS

Office Action dated Nov. 12, 2012 for corresponding Korean Patent Application No. 10-2011-0093561 and its English translation provided by Applicant.

* cited by examiner

*Primary Examiner* — Trung Q Dang
(74) *Attorney, Agent, or Firm* — Ladas & Parry, LLP

(57) ABSTRACT

Disclosed herein is a power module package including: a first substrate having one surface and the other surface; a second substrate contacting one side of one surface of the first substrate; and a first lead frame contacting the other side of one surface of the first substrate. The power module package further includes: a first metal layer formed on one side of one surface of the first substrate; a first bonding layer formed on the first metal layer and contacting a lower surface of the second substrate; a second metal layer formed on the other side of one surface of the first substrate; and a second bonding layer formed on the second metal layer and contacting a lower surface of the first lead frame.

4 Claims, 5 Drawing Sheets

POWER MODULE PACKAGE

CROSS REFERENCE TO RELATED ED APPLICATION

This application claims the benefit of Korean Patent Application No. 10-2011-0093561, filed on Sep. 16, 2011, entitled "Power Module Package", which is hereby incorporated by reference in its entirety into this application.

BACKGROUND OF THE INVENTION

1. Technical Field

The present invention relates to a power module package.

2. Description of the Related Art

Recently, slimness, high performance, and multi-function have been demanded in home or industrial electronic components. In addition, due to an environmental regulation problem, many efforts for increasing energy efficiency have been conducted.

Currently, in home appliances such as a washing machine, a refrigerator, an air conditioner, or the like, an inverter module using a power semiconductor has been used in order to raise energy efficiency. Therefore, high reliability and multi-function have been demanded in a power semiconductor module used as an inverter.

A high power semiconductor module including a power device, for example, a power transistor, an insulated-gate bipolar transistor (IGBT), a metal oxide semiconductor (MOS) transistor, a power rectifier, a power regulator, an inverter, a converter, or a combination thereof is designed to operate at a voltage of 30 to 1000 V or more.

Since the high power semiconductor module operates at a high voltage unlike a low power semiconductor module such as a logical device or a memory device, capability to excellently radiate heat generated from a high power semiconductor chip and insulation capability at a high voltage are demanded.

Meanwhile, Korean Patent No. 0342589 discloses a power module package configured to include a lead frame in which power devices and control devices for controlling the power devices are embedded, an insulator formed on the lead frame, a sealing material formed on the lead frame and the insulator so as to enclose the power devices and the control devices.

Here, the insulator, which is a component substituting for a heat sink, is made of a material having excellent thermal conductivity and has a thin plate shape.

However, in the power module package according to the prior art described above, since the power device and the control device are connected to each other in a state in which they are mounted on a single lead frame, heat generated from the power device is transferred to the control device that is vulnerable to heat, thereby causing damage to the control device.

In addition, according to the prior art, there is a difficulty in simultaneously mounting the power device generating a large amount of heat and the control device vulnerable to heat on a single heat radiating substrate.

SUMMARY OF THE INVENTION

The present invention has been made in an effort to provide a power module package having a structure in which a power device and a control device are thermally separated from each other on a single heat radiating substrate.

Further, the present invention has been made in an effort to provide a power module package having a control part that may form a micro-circuit for high integration.

Further, the present invention has been made in an effort to provide a power module package in which the use of a wire is reduced, such that a manufacturing coat is reduced.

According to a first preferred embodiment of the present invention, there is provided a power module package including: a first substrate having one surface and the other surface; a second substrate contacting one side of one surface of the first substrate; and a first lead frame contacting the other side of one surface of the first substrate.

The power module package may further include: a first metal layer formed on one side of one surface of the first substrate; a first bonding layer formed on the first metal layer and contacting a lower surface of the second substrate; a second metal layer formed on the other side of one surface of the first substrate; and a second bonding layer formed on the second metal layer and contacting a lower surface of the first lead frame.

The power module package may further include: a first bonding layer formed on one side of one surface of the first substrate and contacting a lower surface of the second substrate; a metal layer formed on the other side of one surface of the first substrate; and a second bonding layer formed on the metal layer and contacting a lower surface of the first lead frame.

The power module package may further include: a metal layer formed on one side of one surface of the first substrate; a first bonding layer formed on the metal layer and contacting a lower surface of the second substrate; and a second bonding layer formed on the other side of one surface of the first substrate and contacting a lower surface of the first lead frame.

The power module package may further include: a first bonding layer formed on one side of one surface of the first substrate and contacting a lower surface of the second substrate; and a second bonding layer formed on the other side of one surface of the first substrate and contacting a lower surface of the first lead frame.

The power module package may further include a second lead frame electrically connected to the second substrate by wire bonding.

The power module package may further include a package resin formed to enclose from sides of the first substrate to upper portions of the second substrate and the first lead frame.

The first substrate may be made of ceramic.

The second substrate may be a printed circuit board (PCB).

The power module package may further include a first semiconductor chip mounted on the first lead frame.

The power module package may further include a second semiconductor chip mounted on the second substrate.

According to a second preferred embodiment of the present invention, there is provided a power module package including: a first substrate having a circuit pattern formed on one surface thereof; a second substrate contacting one side of the circuit pattern formed on one surface of the first substrate; and a first lead frame contacting the other side of the circuit pattern formed on one surface of the first substrate.

The second substrate may include: a via; an upper pad connected to an upper portion of the via; and a lower pad connected to a lower portion of the via and contacting the circuit pattern.

The power module package may further include: a first bonding layer formed on the circuit pattern and contacting a lower surface of the second substrate; and a second bonding layer formed on the circuit pattern and contacting the first lead frame.

The first and second bonding layers may be made of solder.

The power module package may further include a second lead frame electrically connected to the second substrate by wire bonding.

The power module package may further include a package resin formed to enclose from sides of the first substrate to upper portions of the second substrate and the first lead frame.

The power module package may further include a first semiconductor chip mounted on the first lead frame.

The power module package may further include a second semiconductor chip mounted on the second substrate.

DESCRIPTION OF THE PREFERRED EMBODIMENTS

Figure 1:
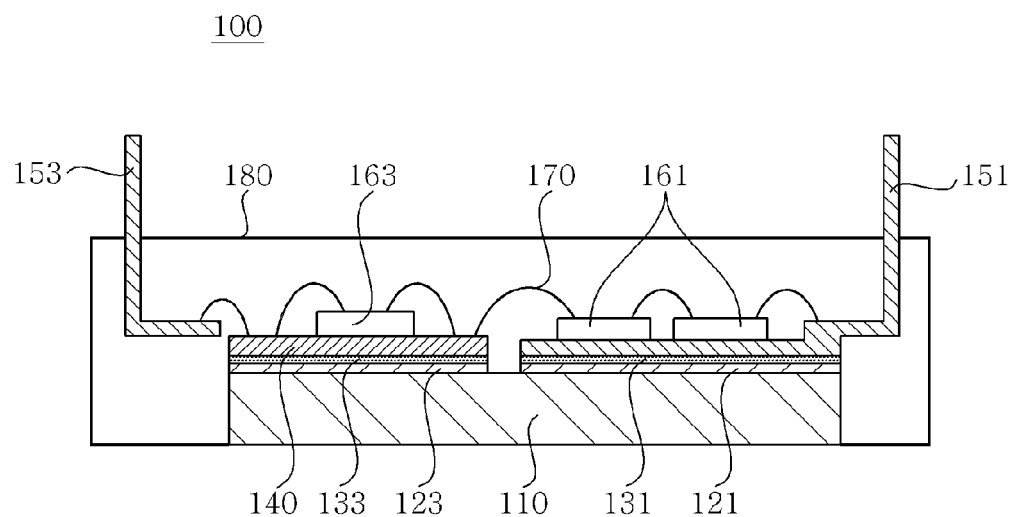
FIG. 1 is a cross-sectional view showing a structure of a power module package according to a first preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

First Preferred Embodiment

FIG. 1 is a cross-sectional view showing a structure of a power module package according to a first preferred embodiment of the present invention.

Referring to FIG. 1, the power module package 100 according to the first preferred embodiment of the present invention includes a first substrate 110, a second substrate 140, and a first lead frame 151.

The first substrate 110 may have one surface and the other surface. One surface means an 'upper substrate', and the other surface means a 'lower surface', based on FIG. 1. Hereinafter, each of one surface and the other surface will be referred to as the 'upper surface' and the 'lower surface.

According to the present embodiment, the first substrate 110 may be a ceramic substrate, but is not particularly limited thereto. That is, the first substrate 110 may include a metal substrate having an anodized layer, a printed circuit board, and a direct bonded copper (DBC) substrate, or the like.

The ceramic substrate may be made of metal based nitride or a ceramic material. Here, the metal based nitride may include aluminum nitride (AlN) or silicon nitride (SiN) and the ceramic material may include aluminum oxide ($Al_2O_3$) or beryllium oxide (BeO), but are not particularly limited thereto.

Meanwhile, the metal substrate may be made of, for example, aluminum (Al) which is a metal material capable of being easily obtained at a relatively low cost and has significantly excellent heat transfer characteristics, or an alloy thereof.

In addition, the anodized layer which is formed by immersing the metal substrate made of aluminum or an alloy thereof in an electrolyte solution such as boric acid, phosphoric acid, sulfuric acid, chromic acid, or the like, and then applying an anode to the metal substrate and applying a cathode to the electrolyte solution, has insulation characteristics and relatively high heat transfer characteristics of about 10 to 30 W/mk.

As described above, the anodized layer made of aluminum or an alloy thereof may be an aluminum anodized layer ($Al_2O_3$).

Since the anodized layer has insulation characteristics, it enables a circuit layer to be formed on the first substrate 110. In addition, since the anodized layer may be formed at a thickness thinner than that of a general insulation layer, it enables thinness simultaneously with further improving heat radiating performance.

According to the present embodiment, the second substrate 140 may be bonded to one side of the upper surface of the first substrate 110 and one end of the first lead frame 151 may be bonded to the other side of the upper surface thereof, but is not particularly limited thereto.

In addition, according to the present embodiment, a first metal layer 123 may be formed on one side of the upper surface of the first substrate 110, and a first bonding layer 133 may be formed on the first metal layer 123. A lower surface of the second substrate 140 may be bonded onto the first bonding layer 133, as shown in FIG. 1.

Further, according to the present embodiment, a second metal layer 121 may be formed on the other side of the upper surface of the first substrate 110, a second bonding layer 131 may be formed on the second metal layer 121, and a lower surface of one end of the first lead frame 151 may be bonded onto the second bonding layer 131, as shown in FIG. 1.

Here, the first and second metal layers 123 and 121 may be formed to be insulated from each other on the first substrate 110. According to the present embodiment, the first and second metal layers 123 and 121 may be made of any one selected from a group consisting of nickel (Ni), copper (Cu), silver (Ag), titanium (Ti), and a chrome (Cr), or an alloy thereof, but is not particularly limited thereto.

In addition, the first and second metal layers 123 and 121 may be formed by a general forming method, for example, a chemical vapor deposition (CVD) method, a physical vapor deposition (PVD) method, an electroplating process or an electroless plating process, or a sputtering process, but is not particularly limited thereto. It may be appreciated by those skilled in the art that all known metal layer forming processes may be used.

In addition, according to the present embodiment, the first and second bonding layers 133 and 131 may be made of a solder based bonding material, but are not limited thereto. That is, the first and second bonding layers 133 and 131 may be made of any adhesive material known in the air, for example, conductive/non-conductive epoxy, or the like.

However, since the solder based bonding material has thermal conductivity higher than those of other bonding materials, the solder based bonding material is generally used in a part requiring high heat radiating characteristics.

According to the present embodiment, the second substrate 140 may be a printed circuit board, but is not particularly limited thereto. That is, the second substrate 140 may be any substrate made of any other material having significantly low thermal conductivity.

The second semiconductor chip 163 is mounted on the second substrate 140 in a subsequent process. Here, the second semiconductor chip 163 may be a control device controlling the driving of a power device.

As described above, the printed circuit board having low thermal conductivity is used as a substrate on which the control device is to be mounted to prevent heat generated from the power device from being transferred to the control device through the first substrate 110, thereby making it possible to minimize damage to the control device.

In addition, the printed circuit board (PCB) on which a micro-circuit may be formed is used as a substrate on which the control device is to be mounted, such that various additional functions are added to a control part, thereby making it possible to perform high integration of the control part.

The power module package 100 according to the present embodiment may further include the second semiconductor chip 163 mounted on the second substrate 140 bonded to one side of the upper surface of the first substrate 110 and first semiconductor chips 161 mounted on the first lead frame 151 bonded to the other side of the upper surface of the first substrate 110.

Here, the first semiconductor chip 161 may include a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode including a combination thereof, but is not particularly limited thereto.

In addition, the second semiconductor chip 163 may include a low power semiconductor chip for controlling the above-mentioned high power semiconductor chip, for example, a control device for controlling the driving of a power device.

Here, each of the first and second semiconductor chips 161 and 163 may be adhered onto the first lead frame 151 and the second substrate 140 using an adhesive member (not shown), wherein the adhesive member (not shown) may be conductive or non-conductive.

For example, the adhesive member (not shown) may be formed through plating or be a conductive paste or a conductive tape. In addition, the adhesive member (not shown) may be solder, metal epoxy, metal paste, resin based epoxy, or an adhesive tape having excellent heat resistance.

As the adhesive tape that may be used as the adhesive member (not shown), for example, commercialized and known high temperature tape such as a glass tape, a silicon tape, a Teflon tape, a stainless foil tape, a ceramic tape, or the like, may be used. In addition, the adhesive member (not shown) may be formed by mixing the above-mentioned materials, but is not particularly limited thereto.

In addition, the power module package 100 according to the present embodiment may further include a second lead frame 153 having one end electrically connected to the second substrate 140 by wire bonding.

The other ends of the first and second lead frames 151 and 153 described above may have a shape in which they are protruded outwardly so that they may be connected to external apparatuses.

The first and second lead frames 151 and 153 are generally made of copper (Cu), but are not to limited thereto. In addition, the first and second lead frames 151 and 153 may have a down-set shape, but are not limited thereto.

Further, the power module package 100 according to the present embodiment may further include wires 170 each electrically connecting between the second lead frame 153 and the second substrate 140, between the second semiconductor chip 163 and the second substrate 140, between the second substrate 140 and the first semiconductor chip 161, and between the first semiconductor chip 161 and the first lead frame 151.

The wires 170 may be connected by ball bonding, wedge bonding, and stitch bonding, but is not particularly limited thereto.

In addition, the power module package 100 according to the present embodiment may further include a package resin 180 formed to enclose from sides of the first substrate 110 described above to the first semiconductor chip 161, the second semiconductor chip 163, and the wires 170.

The package resin 180 is to protect the wires 170 and the first and second semiconductor chips 161 and 163 from an external environment. The package resin 180 may be, for example, an epoxy molding compound (EMC), silicon based epoxy, or the like, but is not particularly limited thereto.

Second Preferred Embodiment

Figure 2:
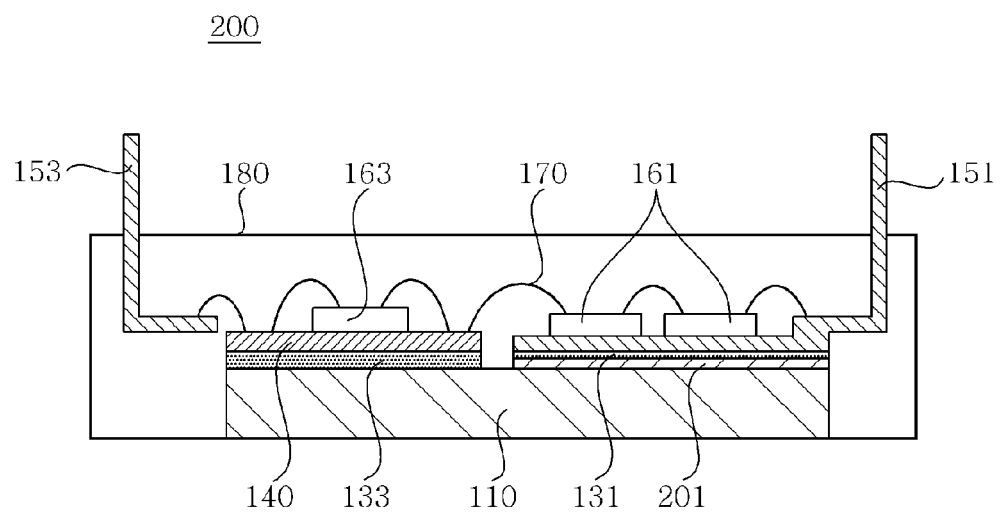
FIG. 2 is a cross-sectional view showing a structure of a power module package according to a second preferred embodiment of the present invention.

FIG. 2 is a cross-sectional view showing a structure of a power module package according to a second preferred embodiment of the present invention.

In the present embodiment, a description of components overlapped with the components described in the first preferred embodiment will be omitted. In addition, the same reference numerals will be used to describe the same components as the components described in the first preferred embodiment.

Referring to FIG. 2, in the power module package 200 according to the present embodiment, a first bonding layer 133 may be formed between one side of an upper surface of a first substrate 110 and a second substrate 140, and a metal layer 201 and a second bonding layer 131 may be formed between the other side of the upper surface of the first substrate 110 and a first lead frame 151, unlike the first preferred embodiment described above.

Here, the first bonding layer 133 may be made of a bonding material such as non-conductive epoxy having low thermal conductivity in order to prevent heat from being transferred from the first substrate 110 to the second substrate 140, but is not particularly limited thereto.

As described above, the first bonding layer 133 is made of a bonding material having low thermal conductivity, such that the power module package 200 according to the present embodiment may implement more complete thermal separation between the first and second substrates 110 and 140 as compared to the power module package 100 according to the first preferred embodiment described above.

In addition, the metal layer is reduced, thereby making it possible to reduce a manufacturing cost of a product, as compared to the power module package 100 according to the first preferred embodiment described above.

Third Preferred Embodiment

Figure 3:
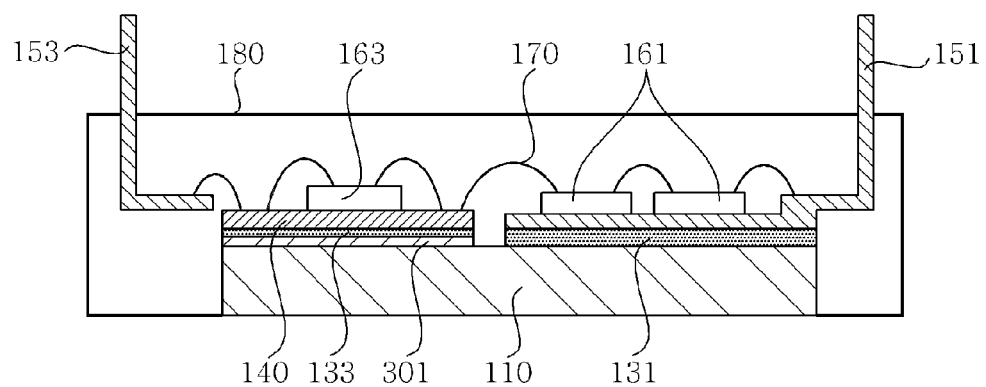
FIG. 3 is a cross-sectional view showing a structure of a power module package according to a third preferred embodiment of the present invention.

FIG. 3 is a cross-sectional view showing a structure of a power module package according to a third preferred embodiment of the present invention.

In the present embodiment, a description of components overlapped with the components described in the first preferred embodiment will be omitted. In addition, the same reference numerals will be used to describe the same components as the components described in the first preferred embodiment.

Referring to FIG. 3, in the power module package 300 according to the present embodiment, a metal layer 301 and a first bonding layer 133 may be formed between one side of an upper surface of a first substrate 110 and a second substrate 140, and a second bonding layer 131 may be formed between the other side of the upper surface of the first substrate 110 and a first lead frame 151, unlike the first preferred embodiment described above.

Here, the second bonding layer 131 may be made of conductive epoxy having high thermal conductivity in order to effectively radiate heat generated from a first semiconductor chip 161 mounted on the first lead frame 151, but is not particularly limited thereto.

In the power module package 300 according to the present embodiment, the use of the metal layer is reduced, thereby making it possible to reduce a manufacturing cost of a product, as compared to the power module package 100 according to the first preferred embodiment described above.

Four Preferred Embodiment

Figure 4:
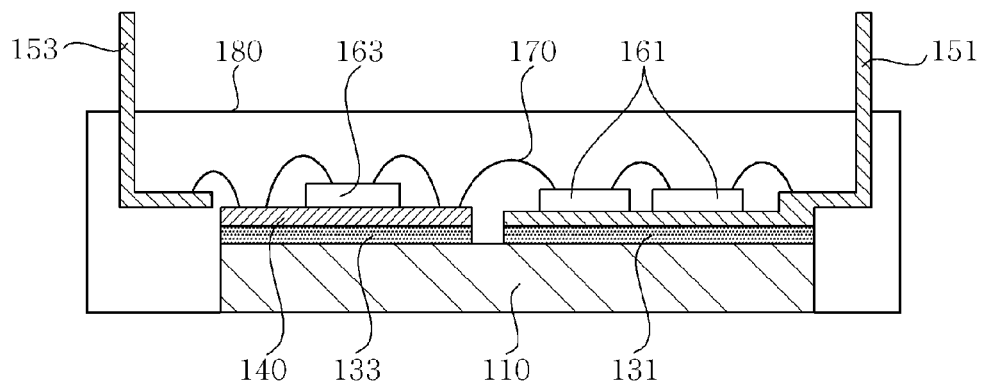
FIG. 4 is a cross-sectional view showing a structure of a power module package according to a fourth preferred embodiment of the present invention.

FIG. 4 is a cross-sectional view showing a structure of a power module package according to a fourth preferred embodiment of the present invention.

In the present embodiment, a description of components overlapped with the components described in the first preferred embodiment will be omitted. In addition, the same reference numerals will be used to describe the same components as the components described in the first preferred embodiment.

Referring to FIG. 4, in the power module package 400 according to the present embodiment, each of first and second bonding layers 133 and 131 may be formed without a metal layer between an upper surface of a first substrate 110 and a second substrate 140 and between the upper surface of the first substrate 110 and a first lead frame 151, unlike the power module package 100 according to the first preferred embodiment described above.

Here, the first bonding layer 133 may be made of non-conductive epoxy having low thermal conductivity in order to prevent heat from being transferred from the first substrate 110 to the second substrate 140 and the second bonding layer 131 may be made of conductive epoxy having high thermal conductivity in order to effectively radiate heat generated from a first semiconductor chip 161 mounted on the first lead frame 151, but are not particularly limited thereto.

In the power module package 400 according to the present embodiment, the metal layer is not formed on the first substrate 110 as shown in FIG. 4, thereby making it possible to reduce a manufacturing cost of a product.

Fifth Preferred Embodiment

Figure 5:
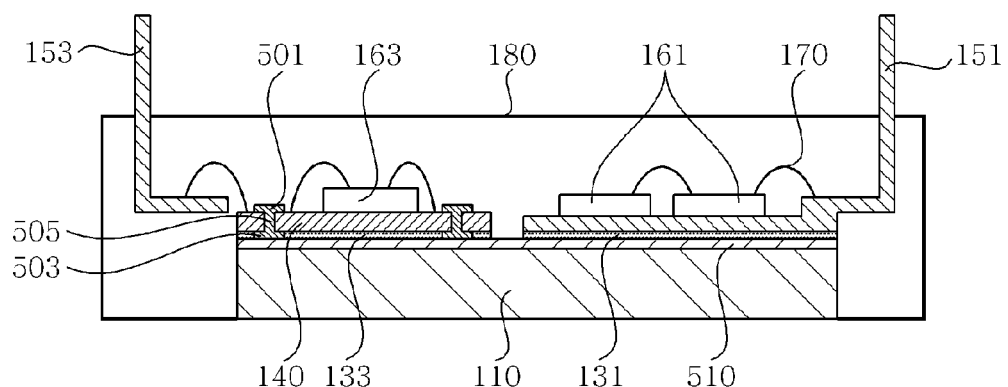
FIG. 5 is a cross-sectional view showing a structure of a power module package according to a fifth preferred embodiment of the present invention.

FIG. 5 is a cross-sectional view showing a structure of a power module package according to a fifth preferred embodiment of the present invention.

In the present embodiment, a description of components overlapped with the components described in the first preferred embodiment will be omitted. In addition, the same reference numerals will be used to describe the same components as the components described in the first preferred embodiment.

Referring to FIG. 5, the power module package 500 according to the present embodiment may include a first substrate 110 having a circuit pattern 510 formed on one surface thereof, that is, an upper surface based on FIG. 5, a second substrate 140 contacting one side of the circuit pattern formed on one surface of the first substrate 110, and a first lead frame 151 contacting the other side of the circuit pattern formed on one surface of the first substrate 110.

The circuit pattern 510 may be made of copper (Cu), nickel (Ni), silver (Ag), gold (Au), and the like, but is not particularly limited thereto.

In addition, the circuit pattern 510 may be formed by a general forming method, for example, a chemical vapor deposition (CVD) method, a physical vapor deposition (PVD) method, an electroplating process or an electroless plating process, or a sputtering process, but is not particularly limited thereto. It may be appreciated by those skilled in the art that all known metal layer forming processes may be used.

According to the present embodiment, the second substrate 140 may include a via 505, an upper pad 501 connected to an upper portion of the via 505, and a lower pad 503 connected to a lower portion of the via 505 to thereby contact the circuit pattern 510.

As described above, through the lower pad 503 connected to the via 505 of the second substrate 140 and contacting the circuit pattern 510 formed on the first substrate 110, a signal may be transferred from a second semiconductor chip 163 to a first semiconductor chip 161 mounted on the first lead frame 151 along the circuit pattern 510.

That is, the first and second semiconductor chips 161 and 163 are electrically connected to each other by the wires 170 in the case of the power module packages according to the first to fourth preferred embodiments described above; however, they may be electrically connected to each other by the via 505, the lower pad 503, and the circuit pattern 510 in the case of the power module package 500 according to the present embodiment.

Figure 6:
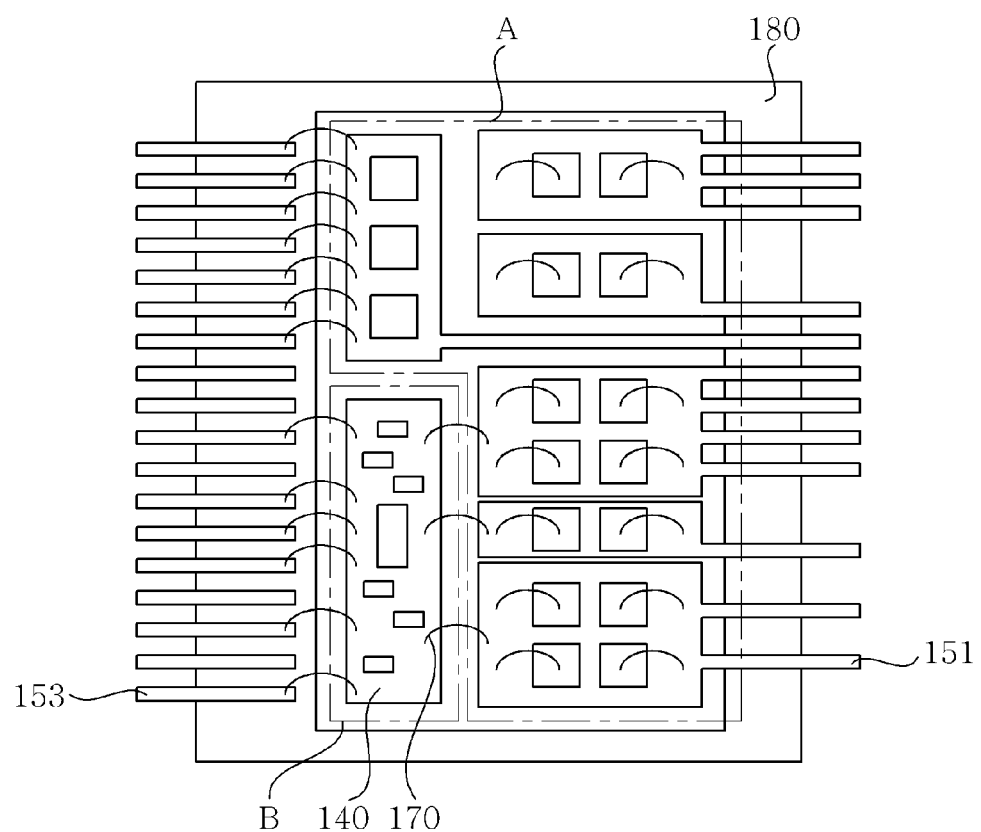
FIG. 6 is a plan view showing the power module package according to the first to fourth preferred embodiments of the present invention.
Figure 7:
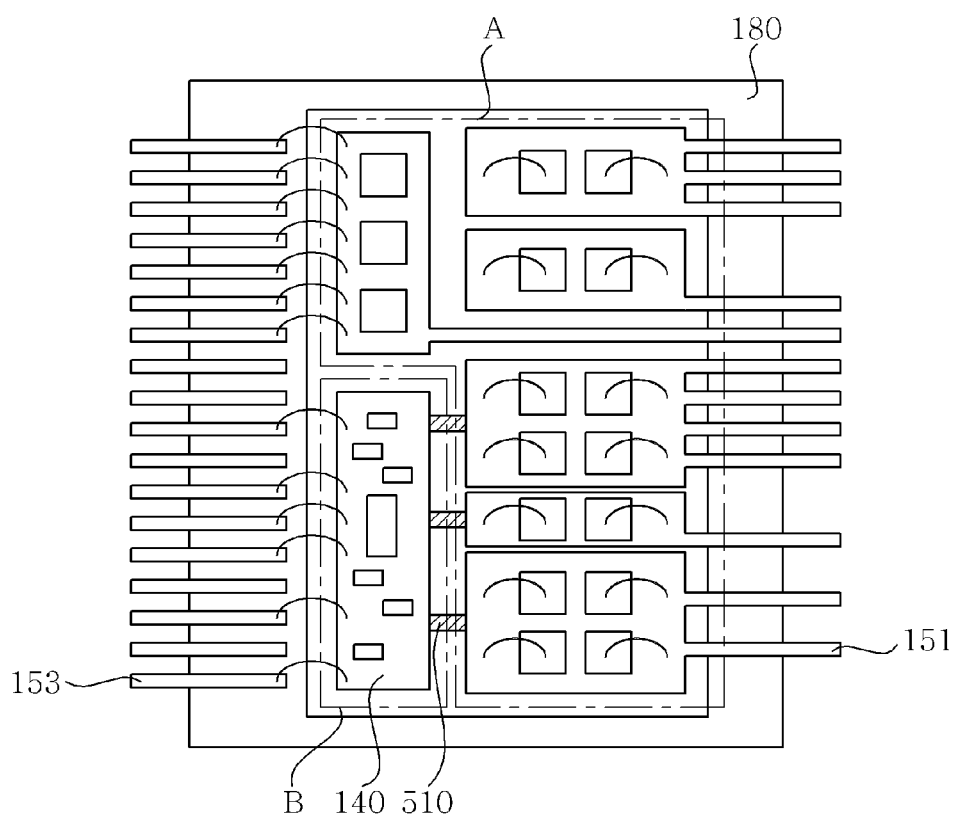
FIG. 7 is a plan view showing the power module package according to the fifth preferred embodiment of the present invention.

For example, viewing a plan view of the power module package according to the first to fourth preferred embodiment of the present invention shown in FIG. 6, the power module package is divided into a power part A and a control part B and the second substrate 140 of the control part B and the first lead frame 151 of the power part A are connected to each other using the wire 170; however, in the power module package according to the fifth preferred embodiment of the present invention shown in FIG. 7, the second substrate 140 of the control part B and the first lead frame 151 of the power part A may be electrically connected to each other by the circuit pattern 510.

As described above, in the power module package 500 according to the present embodiment, the use of the wire 170 is reduced, thereby making it possible to reduce a manufacturing cost of a product, as compared to the power module packages according to the first to fourth preferred embodiments described above.

According to the preferred embodiments of the present invention, a control device is mounted on a printed circuit board having low thermal conductivity and a power device and the control device are thermally separated from each other to prevent heat generated from the power device from being transferred to the control device, thereby making it possible to protect the control device.

In addition, according to the preferred embodiments of the present invention, a printed circuit board is used as a substrate on which the control device is mounted, such that a microcircuit is formed, thereby making it possible to perform high integration of a control part.

Further, according to the preferred embodiments of the present invention, a via and a pad connected thereto are formed in a printed circuit board to electrically connect a control device and a power device to each other through the pad, such that the use of a wire is reduced, thereby making it possible to reduce a manufacturing cost of a product.

Although the preferred embodiments of the present invention have been disclosed for illustrative purposes, they are for specifically explaining the present invention and thus a power module package according to the present invention is not limited thereto, but those skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:
1. A power module package comprising:
a first substrate having a circuit pattern formed on one surface thereof;
a second substrate contacting one side of the circuit pattern formed on one surface of the first substrate; and
a first lead frame contacting the other side of the circuit pattern formed on one surface of the first substrate,
wherein the second substrate includes:
a via;
an upper pad connected to an upper portion of the via; and
a lower pad connected to a lower portion of the via and contacting the circuit pattern.
2. A power module package comprising:
a first substrate having a circuit pattern formed on one surface thereof;
a second substrate contacting one side of the circuit pattern formed on one surface of the first substrate;
a first lead frame contacting the other side of the circuit pattern formed on one surface of the first substrate;
a first bonding layer formed on the circuit pattern and contacting a lower surface of the second substrate; and
a second bonding layer formed on the circuit pattern and contacting the first lead frame,
wherein the first and second bonding layers are made of solder.
3. A power module package comprising:
a first substrate having a circuit pattern formed on one surface thereof;
a second substrate contacting one side of the circuit pattern formed on one surface of the first substrate;
a first lead frame contacting the other side of the circuit pattern formed on one surface of the first substrate; and
a second lead frame electrically connected to the second substrate by wire bonding.
4. A power module package comprising:
a first substrate having a circuit pattern formed on one surface thereof;
a second substrate contacting one side of the circuit pattern formed on one surface of the first substrate;
a first lead frame contacting the other side of the circuit pattern formed on one surface of the first substrate; and
a package resin formed to enclose from sides of the first substrate to upper portions of the second substrate and the first lead frame.

* * * * *